United States Patent [19]
Fujii

[11] Patent Number: 5,675,605
[45] Date of Patent: Oct. 7, 1997

[54] SEMICONDUCTOR SURFACE-EMITTING OPTICAL DEVICE HAVING LIGHT EMITTING LAYER OF ORDERED CRYSTAL STRUCTURE SANDWICHED BETWEEN BRAGG REFLECTORS

[75] Inventor: Hiroaki Fujii, Tokyo, Japan

[73] Assignee: NEC Corporation, Tokyo, Japan

[21] Appl. No.: 610,413

[22] Filed: Mar. 4, 1996

[30] Foreign Application Priority Data

Mar. 3, 1995 [JP] Japan ................................ 7-070558

[51] Int. Cl.$^6$ ................................................ H01S 3/19
[52] U.S. Cl. ............................ 372/96; 257/13; 257/14; 372/45
[58] Field of Search ........................... 372/96, 92, 45; 257/12, 13, 14, 15, 94, 96, 98

[56] References Cited

U.S. PATENT DOCUMENTS

| | | | |
|---|---|---|---|
| 5,204,869 | 4/1993 | Valster et al. | 372/45 |
| 5,296,717 | 3/1994 | Valster et al. | 372/45 |
| 5,490,159 | 2/1996 | Ochi | 372/46 |
| 5,528,615 | 6/1996 | Shima | 372/50 |
| 5,568,499 | 10/1996 | Lear | 372/45 |

OTHER PUBLICATIONS

H. Fujii et al., "Observation of stripe-direction dependence of threshold current ... layer", Appl. Phys. Lett., vol. 61, No. 7, Aug. 17, 1992, pp. 737-739.

G. Gomyo et al., "Evidence for the existence of an ordered state in Ga0.5In0.5P ... energy", Appl. Phys. Lett., vol. 50, No. 11, Mar. 16, 1987, pp. 673-675.

J.A. Lott et al., "Electircally Injected Visible (639-661 nm) ... Emitting Lasers", Electronic Letters, vol. 29, No. 10, May 13, 1993, pp. 830-832.

R.P. Schneider et al., "MOVPE growth of InAlGaP-based visible ... surface-emitting lasers", Journal of Crystal Growth, vol. 124, 1992, pp. 763-771 (no month).

Y. Ueno, "Oscillator strength enhancement for [110]-polarized light ... lasers", Appl. Phys. Lett., vol. 62, No. 62, No. 6, Feb. 8, 1993, pp. 553-555.

*Primary Examiner*—James W. Davie
*Attorney, Agent, or Firm*—Sughrue, Mion, Zinn, Macpeak and Seas

[57] ABSTRACT

An active layer incorporated in a semiconductor surface-emitting optical device is formed of the ordered crystal of GaInP or AlGaInP so that unisotropical photoluminescent characteristics take place in the light generation, and the semiconductor surface-emitting optical device selectively oscillates at a plane of polarization.

9 Claims, 2 Drawing Sheets

SEMICONDUCTOR SURFACE-EMITTING OPTICAL DEVICE HAVING LIGHT EMITTING LAYER OF ORDERED CRYSTAL STRUCTURE SANDWICHED BETWEEN BRAGG REFLECTORS

FIELD OF THE INVENTION

This invention relates to a semiconductor surface-emitting optical device and, more particularly, to a semiconductor surface-emitting optical device having a light emitting layer of a ordered crystal structure sandwiched between Bragg reflectors for controlling a plane of polarization.

DESCRIPTION OF THE RELATED ART

AlGaInP-based visible LD (laser diode) and LED (Light Emitting Diode) have lately been put to practice use and applied to a bar-code reader, a pointer and a display system.

On the other hand, although still under the investigation, a surface-emitting laser is reported by J. A. Lott et. al. in "Electrically Injected Visible (639–661 nm) Vertical Cavity Surface Emitting Lasers", Electronic Letters, 13th, May 1993, vol. 29, pages 830 to 832.

The surface emitting lasers are an important device, because the mass-production is expected to reduce the price. It is practically important to stabilize the plane of polarization of the surface-emitting laser or the surface-emitting LED. When a visible LD is, by way of example, used as a light source of an opto-magnetic disk system, a problem is encountered in that unstable plane of polarization deteriorates the signal-to-noise ratio. When it is used in a plastic-fiber system, a stable plane of polarization achieves a high-quality communication.

Moreover, in case of an integrated light source, the stable plane of the surface-emitting laser or the surface-emitting LED is very important.

However, a try to control the plane of polarization for laser light or LED light have not been reported yet in the surface-emitting lasers in AlGaInP system and the surface-emitting LEDs in the AlGaInP system.

Although an off-substrate was used for controlling the plane of polarization for laser light in the InGaAs system, it is not said to be a simple technique. As described hereinbefore, there are various advantages in the control of the plane of polarization in the surface-emitting optical device. For this reason, it is important to control the plane of polarization for an AlGaInP surface-emitting LEDs in a simple way.

SUMMARY OF THE INVENTION

The present inventor contemplated the problem described hereinbefore, and aims at provision of a semiconductor surface-emitting optical device a plane of polarization of which is simply controlled.

In order to achieve the object, the present inventor provides a semiconductor surface-emitting optical device comprising an active layer having an ordered crystal structure, and serving as a light-emitting layer, and clad layers of a type serving as a Bragg reflector sandwiching the active layer for highly reflecting emitted light.

The semiconductor surface-emitting optical device may have the active layer containing GaInP or AlGaInP. In this instance, the group III element of the active layer may be Cu-Pt type ordered state.

The semiconductor surface-emitting optical device may have the active layer containing GaInAs or AlGaInAs. In this instance, the group III element of the active layer may be the ordered state.

In accordance with another aspect of the present invention, there is provided a semiconductor surface-emitting optical device comprising: a substrate of a first conductivity type having a major surface; a first clad layer of the first conductivity type formed on the major surface; an active layer having at least one light generating layer formed from an ordered crystal of a compound semiconductor material; a second clad layer having a second conductivity type opposite to the first conductivity type, and formed on the active layer so as to form a Bragg reflector together with the first clad layer; and electrodes connected to a back surface of the substrate and an upper surface of the second clad layer, respectively, so as to apply a potential to the active layer.

BRIEF DESCRIPTION OF THE DRAWINGS

The features and advantages of the semiconductor surface-emitting optical device according to the present invention will be more clearly understood from the following description taken in conjunction with the accompanying drawings in which.

DESCRIPTION OF THE PREFERRED EMBODIMENT

Figure 1:
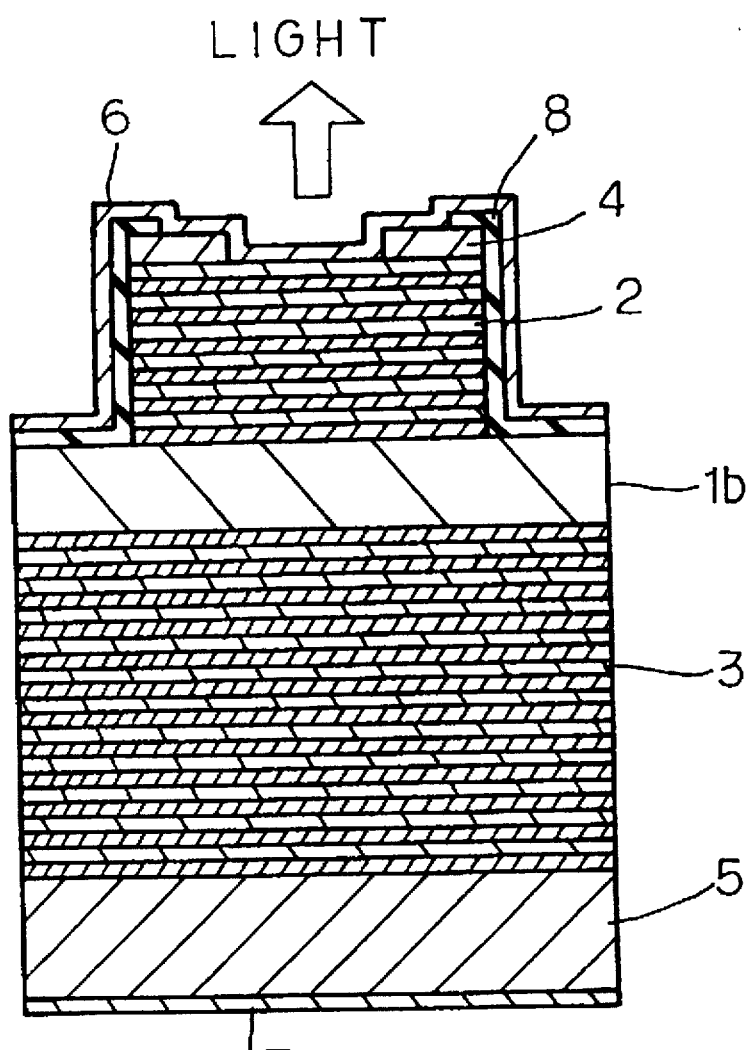
FIG. 1 is a cross sectional view showing the structure of a semiconductor surface-emitting optical device according to the present invention.
Figure 2:
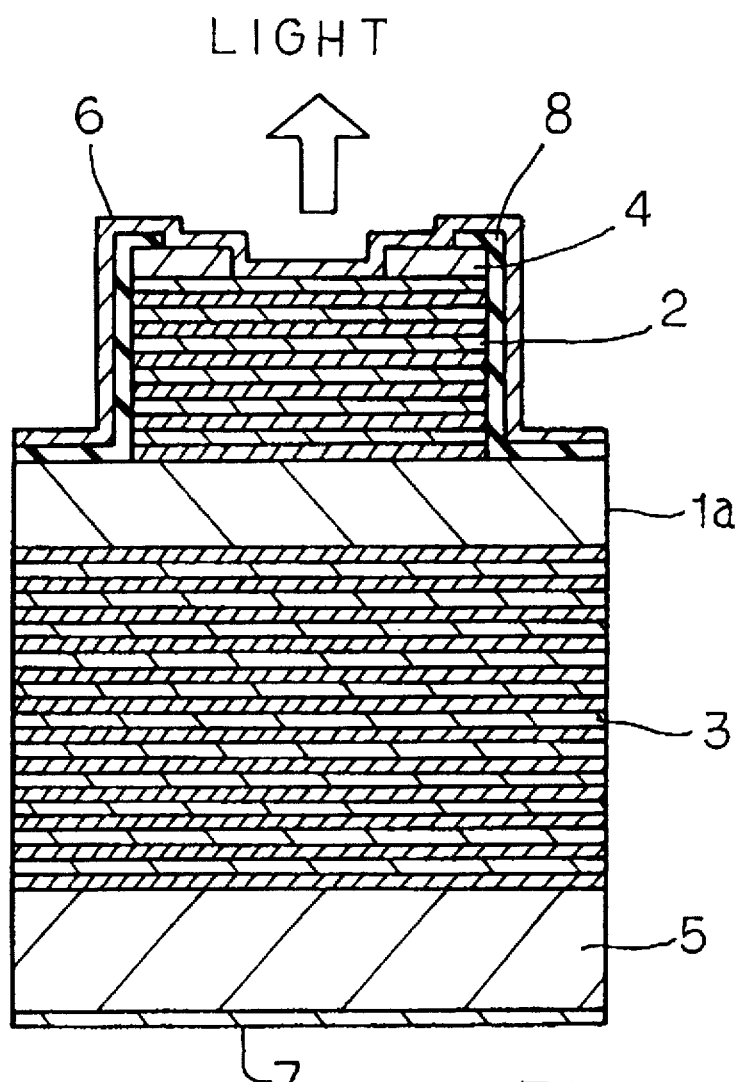
FIG. 2 is a cross sectional view showing the structure of a prior art semiconductor surface-emitting optical device.

FIG. 1 illustrates a sectional structure of a semiconductor surface-emitting optical device embodying the present invention. The structure of a prior art semiconductor surface-emitting optical device is illustrated in FIG. 2. Although description is made on the device in AlGaInP system, the present invention is applicable to a device in the AlGaInAs system.

The prior art semiconductor surface-emitting optical device comprises an active layer 1a serving as a light emitting layer, a p-type clad layer 2 and an n-type clad layer 3. The clad layers 2 and 3 sandwich the active layer 1a on the upper and lower surfaces thereof, and form in combination a distributed Bragg reflector.

On the other hand, the semiconductor surface-emitting optical device comprises an active layer 1b and the clad layers 2 and 3 also sandwiching the active layer 1b on the upper and lower surfaces thereof. The clad layers 2 and 3 also form in combination the distributed Bragg reflector.

The active layers 1b includes a multiple quantum well structure having GaInP wells and separated confinement heterostructures serving as guide layers sandwiching the multiple quantum well structure on the upper and lower surfaces thereof. The multiple quantum well structure is replaceable with a single quantum well structure having a GaInP well. The multiple quantum well structure/separated confinement heterostructure or the signal quantum well structure/separated confinement heterostructure is desirable for the active layer 1b. The active layer 1a is similar in structure to the active layer 1b.

The clad layers 2 and 3 have a multi-layer structure of a GaInP layer and an AlGaInP layer. A multi-layer structure of an AlGaAs layer and an AlAs layer is available for the clad layer 2/3. A distributed Bragg reflector, in which the AlGaAs layer is expected to be formed of crystal higher in energy than the wavelength of the emitted light, is implemented by a combination of GaInP for a quarter wavelength and AlGaInP for a quarter wavelength.

The p-type clad layer 2 is overlain by a p-type GaAs cap layer 4, and the n-type clad layer 3 is fabricated on an n-type GaAs substrate 5. A pair of electrodes 6/7 applies a potential between the p-type clad layer 2 and the n-type clad layer 3. A silicon oxide layer 8 extends on an exposed surface of the active layer 1a/1b, the side surface of the p-type clad layer 2, the side surface of the p-type GaAs cap layer 4 and an upper peripheral area of the p-type GaAs cap layer 4.

The n-type clad layer 3 of the distributed Bragg reflector on the substrate side is odd times thicker than a half wavelength such as 50.5 lambda. Lambda is the wavelength in the medium. On the other hand, the p-type clad layer 2 of the distributed Bragg reflector on the output surface side is even times such as 30 times thicker than the half wavelength Lambda.

The semiconductor surface-emitting optical device according to the present invention is different from the prior art semiconductor surface-emitting optical device in that the group-III element such as Al, Ga and/or In of GaInP or AlGaInP incorporated in the active layer 1b is in Cu-Pt (copper-platinum) type ordered state. In other words, the active layer 1b contains a crystal structure formed in a natural superlattice.

Several research groups, one of which the present inventor participated in, have reported the natural superlattice (see Applied Physics Letters, vol. 50, pages 673, 1987 reported by A. Gomyo et. al.).

In general, crystals are mixed at random in a mixed crystal structure such as GaInP, i.e., disordered. Ga and In are arranged in a predetermined order on the sublattice of group-III element under pre-selected growing conditions, and are ordered. In other words, a spontaneous ordering takes place on the group-III sublattice. As a result, the ordering results in the forbidden band gap of the mixed crystal narrower than the standard forbidden band gap by tens meV. The composition ratio of the mixed crystal uniformly determines the standard forbidden band gap.

The ordered crystal makes the photoluminescent characteristics unisotropical, and the theoretical study and the experiments have been reported by a research group in which the present inventor participated. In detail, the theoretical calculation is reported by Y. Ueno et. al. in "Oscillator Strength Enhancement for [110]-Polarized Light in Compressively Strained GaInP Ordered Crystal Used in AlGaInP Lasers", Applied Physics Letters, vol. 62(6), 8 Feb. 1993, pages 553 to 555, 1993 American Instituted of Physics. Actual observation of laser emitting is reported by H. Fujii et. al. in "Observation of Stripe-Direction Dependence of Threshold Current Density for AlGaInP Laser Diodes with Cu-Pt-type Natural Superlattice in $Ga_{0.5}In_{0.5}P$ Active Layer", Applied Physics Letters, vol. 61(7), 17 Aug. 1992, pages 737 to 739, 1992, American Instituted of Physics.

When the active layer or the light emitting layer of a semiconductor surface-emitting optical device is formed of the ordered crystal, a surface-emitting laser selectively oscillates at the single plane of polarization so as to generate [110] polarized light, and a surface-emitting LED generates light at one plane of polarization much stronger than the other, i.e., $[110]/[-110] \geq 2$.

The configuration of the natural superlattice or the ordered crystal is controllable by using a MOVPE (Metal Organic Vapor Phase Epitaxy), MBE (Molecular Beam Epitaxy) or GSMBE (Gas Source Molecular Beam Epitaxy).

The superlattice has been confirmed in the AlGaInAs system, and is considered to have the optical unisotropy. However, there is no report on the control of the plane of polarization in an AlGaInP surface-emitting optical device by using the ordered crystal.

On the contrary, according to "MOVPE growth of InAlGaP-based visible vertical-cavity surface-emitting lasers" reported by R. P. Schneider of Sandia National Laboratories et. al., Journal of Crystal Growth, vol. 124, pages 763 to 771, 1992, the ordered crystal gave rise to the full-width at half-maximum of the polarized photoluminescence at 12° K. Therefore, Schneider et. al. recommended the disordered crystal, and fabricated a surface-emitting laser device by using the disordered crystal.

The present inventor fabricates an epok making semiconductor surface-emitting optical device according to the present invention as follows. The n-type GaAs substrate 5 was placed in a MOVPE growing system, and the epitaxial growth was carried out about 76 torr. The temperature was maintained as low as 650 degrees in centigrade so as to form the ordered crystal. The n-type clad layer 3 of the n-GaInP/n-AlGaInP multi-layer structure, the active layer 1b of the GaInP multiple quantum well structure/separated confinement heterostructure, the p-type clad layer 2 of the GaInP/p-AlGaInP multi-layer structure and the p-type GaAs cap layer 4 were successively grown on the n-type GaAs substrate 5.

The GaInP layer for a quarter wavelength was combined with the AlGaInP layer for a quarter wavelength, and the combination formed the clad layers 2 and 3. The n-type clad layer 3 had the total thickness odd times larger than a half wavelength such as, for example, 50.5×lambda where lambda is the wavelength in the medium. The p-type clad layer 2 had the total thickness even times larger than the half wavelength such as, for example, 30 lambda.

The active layer 1b had four well layers each formed of GaInP strained at +0.3% and 8 nanometers thick, barrier layers each formed of non-strained AlGaInP and 5 nanometers thick and uppermost/lowermost guide layers of AlGaInP, and the total thickness of the multiple quantum well structure/separated confinement heterostructure was equal to the product of the half wavelength multiplied by an integer.

An appropriate mask was provided on the GaAs cap layer 4, and the p-type clad layer 2 was formed by using a dry etching such as a reactive ion etching. Etchant gas contained cl. The dry etching was controlled with time until the upper guide layer of the active layer 1b was exposed. The p-type clad layer 2 thus patterned decreased invalid current, and restricted the divergence of the light-emitting mode.

The p-type GaAs cap layer 4 was partially removed by using a wet etching so as to form a window for a optical radiation. Silicon oxide was deposited over the entire surface of the structure, and the exposed surface was covered with the silicon oxide layer 8. The silicon oxide layer 8 was partially removed from the upper surface of the p-type GaAs cap layer 4 and the window, and the p-type clad layer 2 was partially exposed to the window.

The electrodes were finally formed on the silicon oxide layer 8 and the back surface of the n-type GaAs substrate 5 by using a p-n current evaporation, and polished. The electrode 6 was held in contact through the window with the p-type clad layer 2.

When an appropriate bias potential was applied between the electrodes 6 and 7, the semiconductor surface-emitting optical device oscillated, and the wavelength of the light was 670 nanometers.

A particular feature of the semiconductor surface-emitting optical device according to the present invention is directed to the GaInP layers or the AlGaInP layers incorporated in the active layer 1b for emitting the light, and the forbidden band gas of the GaInP/AlGaInP layers is lower in energy than the forbidden bang gap of a disordered crystal which is determined by the composition of the mixed crystal. In other words, the light emitting layers of the active layer 1b are formed of the ordered crystal in the AlGaInP system having the natural superlattice. This feature solves the problem inherent in the prior art semiconductor surface-emitting optical device, because the unisotropical photoluminescence characteristics of the ordered crystal controls the plane of polarization.

In this instance, the ordered crystal grown under the conditions was 70 meV lower in energy than a perfectly disordered crystal identical in composition with the ordered crystal.

The semiconductor surface-emitting layer device according to the present invention selectively oscillated at a single plane of polarization, and only [110] polarized light was generated.

The semiconductor surface-emitting LED according to the present invention generated light at one plane of polarization much stronger than the light at the other plane. The intensity of [110] polarized light was at least twice stronger than the intensity of [−110] polarized light.

Even if the AlGaInAs material system is used, the advantages are also achieved.

As will be understood from the foregoing description, the active layer according to the present invention is formed of the ordered crystal, and the unisotropy easily controls the plane of polarization for the radiated light. When the present invention is applied to the surface-emitting laser device, the laser device selectively oscillates at a single plane of polarization. On the other hand, when the present invention is applied to the surface-emitting LED, the LED generates the light at one plane of polarization much stronger than the other.

Although particular embodiments of the present invention have been shown and described, it will be obvious to those skilled in the art that various changes and modifications may be made without departing from the spirit and scope of the present invention.

What is claimed is:

1. A semiconductor surface-emitting optical device comprising:

an active layer having an ordered crystal structure, and serving as a light-emitting layer; and clad layers of a type serving as a Bragg reflector sandwiching said active layer for highly reflecting emitted light.

2. The semiconductor surface-emitting optical device as set forth in claim 1, in which said active layer contains a material selected from the group consisting of GaInP and AlGaInP, and the group-III element of said active layer is in Cu-Pt-type ordered state.

3. The semiconductor surface-emitting optical device as set forth in claim 1, in which said active layer contains a material selected from the group consisting of GaInAs and AlGaInAs, and the group-III element of said active layer is in ordered state.

4. A semiconductor surface-emitting optical device comprising:

an active layer having an ordered crystal structure so as to selectively control a plane of polarization for an output light, and serving as a light-emitting layer; and clad layers of a type serving as a Bragg reflector sandwiching said active layer for highly reflecting emitted light.

5. A semiconductor surface-emitting optical device comprising:

a substrate of a first conductivity type having a major surface;

a first clad layer of said first conductivity type formed on said major surface;

an active layer having at least one light generating layer formed from an ordered crystal of a compound semiconductor material;

a second clad layer having a second conductivity type opposite to said first conductivity type, and formed on said active layer so as to form a Bragg reflector together with said first clad layer; and electrodes connected to a back surface of said substrate and an upper surface of said second clad layer, respectively, so as to apply a potential to said active layer.

6. The semiconductor surface-emitting optical device as set forth in claim 1, in which said active layer includes a multiple quantum well structure, a first separated confinement heterostructure provided on an upper surface of said multiple quantum well structure and a second separated confinement heterostructure provided on an lower surface of said multiple quantum well structure.

7. The semiconductor surface-emitting optical device as set forth in claim 5, in which said active layer includes a single quantum well structure, a first separated confinement heterostructure provided on an upper surface of said single quantum well structure and a second separated confinement heterostructure provided on an lower surface of said single quantum well structure.

8. The semiconductor surface-emitting optical device as set forth in claim 5, in which said compound semiconductor material is selected from the group consisting of GaInP and AlGaInP having group-III element in ordered state.

9. The semiconductor surface-emitting optical device as set forth in claim 5, in which a natural superlattice is generated in said light generating layer.

* * * * *